United States Patent [19]

Takayanagi et al.

[11] Patent Number: 4,602,244

[45] Date of Patent: Jul. 22, 1986

[54] INTEGRATED INJECTION LOGIC CIRCUIT

[75] Inventors: Yoshiyuki Takayanagi; Masashi Takeda, both of Kanagawa, Japan

[73] Assignee: Sony Corporation, Tokyo, Japan

[21] Appl. No.: 604,486

[22] Filed: Apr. 27, 1984

[30] Foreign Application Priority Data

May 9, 1983 [JP] Japan .................................. 58-80621
May 9, 1983 [JP] Japan ............................. 58-68940[U]

[51] Int. Cl.⁴ .............................................. H03M 1/12
[52] U.S. Cl. .............................. 340/347 DA; 307/459
[58] Field of Search ................. 340/347 DA; 307/459

[56] References Cited

PUBLICATIONS

Digital Fundamentals by Thomas L. Floyd, pp. 530–532, Charles E. Merrill Publishing Co., 1982.
Practical Solid-State Circuit Design by G. E. Oleksy, Howard W. Sams & Co. Inc., 1981, pp. 38–43.
Electronic Integrated Circuits and Systems by Franklin C. Fitchen Van Nostrand Company, 1970, pp. 120–123.

*Primary Examiner*—William M. Shoop, Jr.
*Assistant Examiner*—Saul M. Bergmann
*Attorney, Agent, or Firm*—Lewis H. Eslinger; Alvin Sinderbrand

[57] ABSTRACT

An integrated injection logic circuit having constant current source transistors and switching inverter transistors. The injector thereof is directly connected to a first reference potential point and the wall thereof is connected through a bias resistor or constant current source to a second reference potential point.

17 Claims, 8 Drawing Figures

+B
43
Q33
Q43
Q32
Q42
Q31
Q41
42
WLb
41b
41a
GATE CIRCUIT
16
WLa
GATE CIRCUIT
15
IJ
Q21
14
Q11
11
12
13

INTEGRATED INJECTION LOGIC CIRCUIT

BACKGROUND OF THE INVENTION

1. Field of the Invention

The present invention relates to improvements of an integrated injection logic circuit.

2. Description of the Prior Art

A conventional integrated injection logic circuit (hereinafter simply referred to as $I^2L$ circuit ) will hereinafter be described with reference to FIG. 1. In FIG. 1, reference numeral 6 generally designates an $I^2L$ circuit wherein reference numerals 1 and 2 respectively designate input and output terminals thereof. Reference characters Q11 and Q12 respectively designate constant current source transistors of PNP type and Q21 and Q22 switching inverter transistors of NPN type. The emitters of the transistors Q11 and Q12 are connected together to an injector IJ and the injector IJ is connected through a resistor 3 to a voltage source +B (for example, +5 V). The collectors of the transistors Q11 and Q12 are respectively connected to the bases of the transistors Q21 and Q22, and the collector of the transistor Q21 is connected to the base of the transistor Q22. The emitters of the transistors Q21 and Q22 and the bases of the transistors Q11 and Q12 are all connected to a wall WL and the wall WL is grounded. In general, a unit circuit formed of a constant current source transistor and a switching inverter transistor supplied at its base with the constant current from the constant current source transistor can arbitrarily be connected in cascade between the injector IJ and the wall WL.

Further, an NPN transistor Q20 is provided the collector of which is connected to the base of the transistor Q21. The emitter thereof is connected to the wall WL and from the base of which is led out the input terminal 1. The output terminal 2 is led out from the collector of the transistor Q22.

Reference numeral 4 designates an output terminal of a circuit to be connected to the $I^2L$ circuit 6 at its input side. This output terminal 4 is connected through an interface circuit 5 to the input terminal 1 of the $I^2L$ circuit 6.

The logic high level and the logic low level developed at the output terminal 2 of such $I^2L$ circuit 6 are respectively about 0.7 V and 0 V. Accordingly, when the logic high level and the logic low level of the output developed at the output terminal 4 of the circuit (for example, TTL (transistor-transistor logic) circuit) to be connected to the input side of the $I^2L$ circuit 6 are respectively 4 V and 1 V, since the withstanding voltage of the $I^2L$ circuit 6 is approximately 1.4 V, the input interface circuit 5 connected therebetween must have a quite complicated structure.

An example of the 3-bit D/A (digital-to-analog) converter using such $I^2L$ circuit as a gate circuit will be described with reference to FIG. 2. Reference numerals 11, 12 and 13 respectively designate input terminals of 3-bit digital signals, and the 3-bit digital signals are respectively supplied therefrom to gate circuits 14, 15 and 16, each of which is formed of the $I^2L$ circuit. Reference numerals Q31, Q32 and Q33 respectively designate first constant current source transistors of PNP type and the transistors Q32 and Q33 are made as multi-transistors. The ratio of the collector currents of the transistors Q31, Q32 and Q33 is selected as 1:2:4. The emitters of the transistors Q31, Q32 and Q33 are respectively connected through an injector IJ and a resistor 17 to the voltage source +B. Reference numerals Q41, Q42 and Q43 respectively designate second constant current source transistors of PNP type, and the transistors Q42 and Q43 are made as multi-transistors. The ratio of the collector currents of the transistors Q41, Q42 and Q43 is selected also as 1:2:4, and the emitters of the transistors Q41, Q42 and Q43 are respectively connected to the collectors of the transistors Q31, Q32 and Q33 and the collectors of the transistors Q41, Q42 and Q43 are connected together. The bases of the transistors Q31 to Q33 and Q41 to Q43 are respectively connected to the wall WL and the wall WL is grounded through a diode 18.

Reference numeral 19 designates a current to voltage converting circuit. The collectors of the transistors Q41 to Q43 are connected together to a base of an NPN transistor 20 in the circuit 19 and the base of the transistor 20 is grounded through a diode 21. The emitter of the transistor 20 is grounded and the collector thereof is connected through a load resistor 22 to the voltage source +B and connected to an output terminal 23.

This D/A converter requires the current to voltage converting circuit 19 because the above $I^2L$ circuit shown in FIG. 1 is used as the gate circuits 14 to 16 thereof. As a result, the non-linear factor such as Early effect or the like of the output transistor 20 is added to the output of the D/A converter, thus obstructing the characteristic of the D/A converter from being improved.

OBJECTS AND SUMMARY OF THE INVENTION

Accordingly, an object of the present invention is to provide an improved $I^2L$ (integrated injection logic) circuit.

Another object of the present invention is to provide an $I^2L$ circuit which can simplify the circuit arrangement of an input interface circuit.

A further object of the present invention is to provide a D/A (digital-to-analog) converter having excellent precision as compared with a conventional D/A converter.

According to one aspect of the present invention, there is provided an integrated injection logic circuit comprising:

at least one constant current source transistor;

at least one switching inverter transistor;

an injector directly connected to a first reference potential; and a wall.

The other objects, features and advantages of the present invention will become apparent from the following description taken in conjunction with the accompanying drawings through which the like references designate the same elements and parts.

DESCRIPTION OF THE PREFERRED EMBODIMENTS

Figure 1:
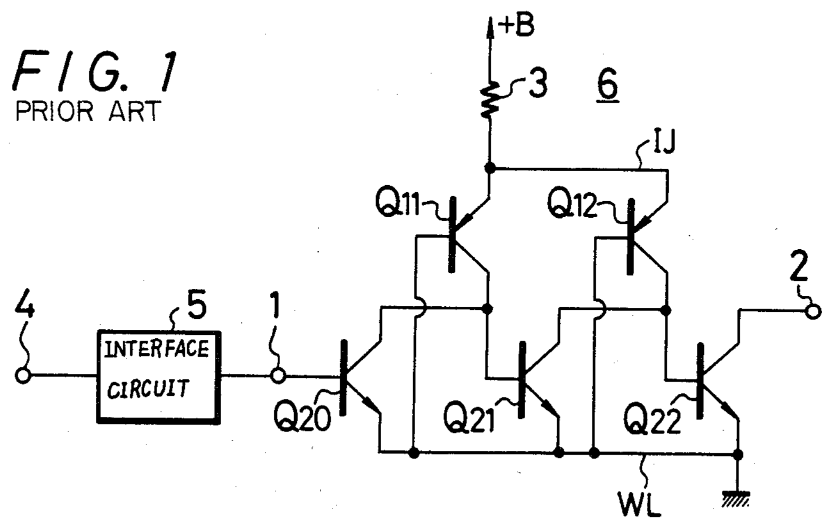
FIG. 1 is a circuit diagram showing a prior art integrated injection logic circuit.
Figure 3:
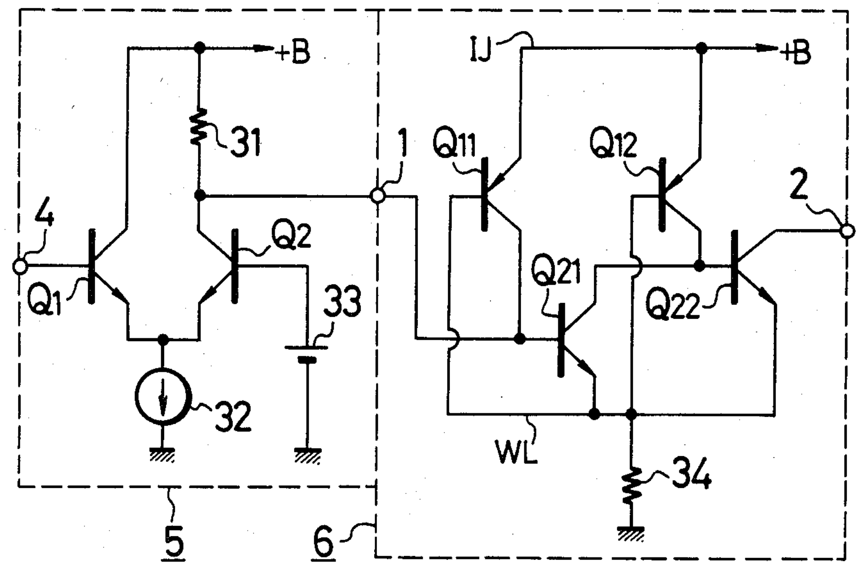
FIG. 3 is a circuit diagram showing an embodiment of the $I^2L$ (integrated injection logic) circuit according to the present invention.

Now, an embodiment of the $I^2L$ (integrated injection logic) circuit according to the present invention will hereinafter be described with reference to FIG. 3. In FIG. 3, like parts corresponding to those in FIG. 1 are marked with the same references and will not be described in detail.

As shown in FIG. 3, the injector IJ to which the emitters of the constant current source transistors Q11 and Q12 of NPN type are all connected is directly coupled to the voltage source +B (for example, +5 V). The emitters of the switching inverter transistors Q21 and Q22 of NPN type and the bases of the constant current source transistors Q11 and Q12 are respectively connected to the wall WL, and the wall WL is grounded through a bias resistor 34. The bias resistor 34 may be replaced with a constant current source.

The circuit arrangement of the input interface circuit 5 for such $I^2L$ circuit 6 will be described next. Reference numeral 4 designates the output terminal of the circuit (for example, TTL circuit) to be connected to the $I^2L$ circuit 6 at its input side. This output terminal 4 is connected to the base of a first transistor Q1 of NPN transistors Q1 and Q2 of a differential transistor configuration. The emitters of the transistors Q1 and Q2 are together grounded through a constant current source 32, and the base of the transistor Q2 is connected to a reference potential source 33. The collector of the transistor Q1 is directly connected to the voltage source +B, while the collector of the transistor Q2 is connected through a resistor 31 to the voltage source +B and directly to the input terminal 1 which is led out from the base of the transistor Q21 in the $I^2L$ circuit 6. When the voltage of the voltage source +B is taken as 5 V, the voltage of the reference potential source 33 is selected to be, for example, 2.5 V.

In such $I^2L$ circuit 6 as shown in FIG. 3, the logic high level of the output developed at the output terminal 2 is 5 V and the logic low level thereof is 4.3 V, respectively. Consequently, if the circuit such as the TTL circuit having the logic high level of 4 V and the logic low level of 1 V is connected to the input side of the $I^2L$ circuit 6, the input interface circuit 5 can be constructed by the circuit with the simple circuit arrangement as shown in FIG. 3.

Figure 2:
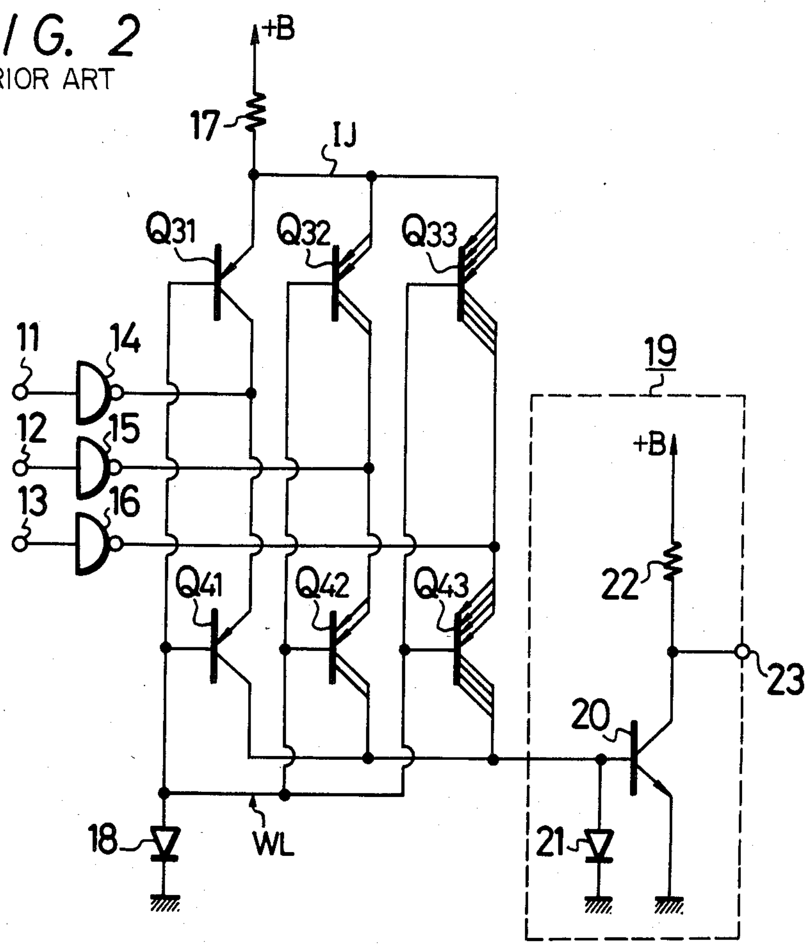
FIG. 2 is a circuit diagram showing a prior art D/A (digital-to-analog) converter.
Figure 4:
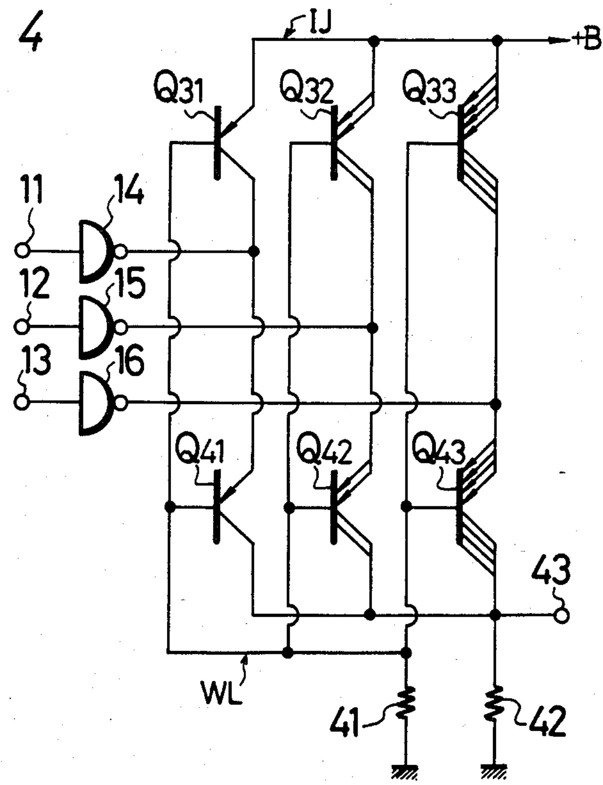
FIGS. 4, 5 and 7 are schematic diagrams respectively showing a digital to analog converter in which the $I^2L$ circuit according to the present invention is used.

An example of a D/A converter using the $I^2L$ circuit of the present invention shown in FIG. 3 as its gate circuits will be described with reference to FIG. 4. In FIG. 4, like parts corresponding to those in FIG. 2 are marked with the same references and will not be described in detail. The $I^2L$ circuit of the present invention described in connection with FIG. 3 is used as each of the gate circuits 14, 15 and 16. The injector IJ to which the emitters of the first constant current source transistors Q31, Q32 and Q33 are connected is directly connected to the voltage source +B. The collectors of the second constant current source transistors Q41, Q42 and Q43 are connected together from which an output terminal 43 is led out and which is grounded through a load resistor 42. Further, the wall WL to which the bases of the transistors Q31 to Q33 and Q41 to Q43 are connected is grounded through a bias resistor 41.

As described above, unlike the D/A converter shown in FIG. 2, the D/A converter shown in FIG. 4 does not require the current to voltage converting circuit so that the nonlinear factor such as Early effect or the like of the output transistor is never added to the output of the D/A converter, thus the D/A converter with excellent characteristic being obtained.

Figure 5:
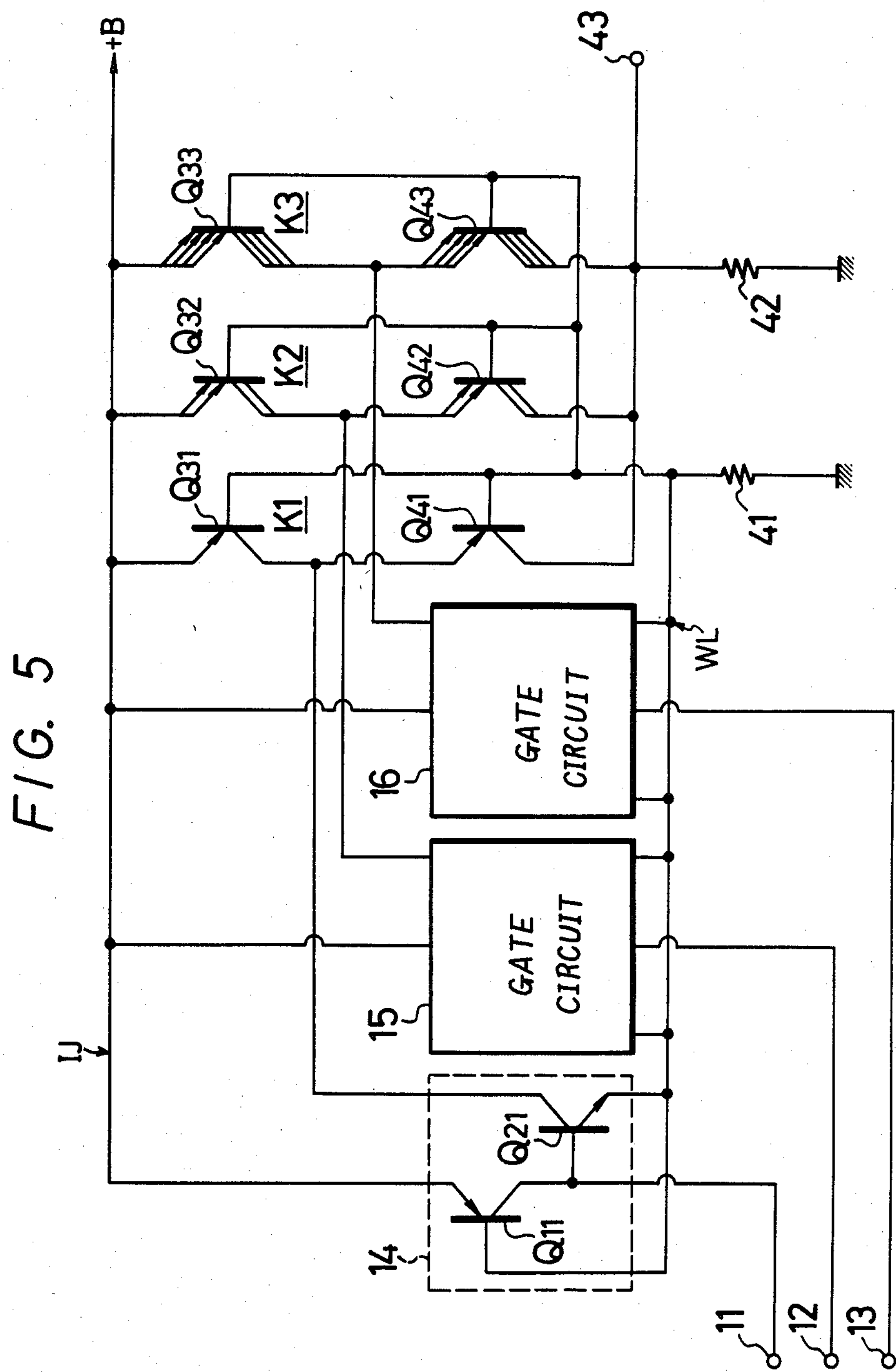

The improved example of the afore-mentioned D/A converter will be described with reference to FIG. 5. In FIG. 5, like parts corresponding to those in FIG. 4 are marked with the same references and will not be described in detail. Reference numerals 14 to 16 designate the gate circuits for the input terminals 11 to 13, each gate circuit being formed of the $I^2L$ circuit as set forth above. More particularly, each of the gate circuits 14 to 16 is formed of the constant current source transistor Q11 of PNP type and the switching inverter transistor Q21 of NPN type. Reference numerals K1 to K3 respectively designate constant current circuits, each of which is formed of a series circuit of the PNP transistors Q31 to Q33 and Q41 to Q43. When the D/A converter is formed of the $I^2L$ circuit, the emitters of the NPN transistors Q21 in the gate circuit 14 to 16 and the bases of the PNP transistors Q31 to Q33 and Q41 to Q43 are all connected to the common wall WL. Then, an analog signal based on the sum of constant currents from the constant current circuits which are selected in response to the digital signals supplied to the input terminals 11 to 13 is developed at the output terminal 43.

Figure 6:
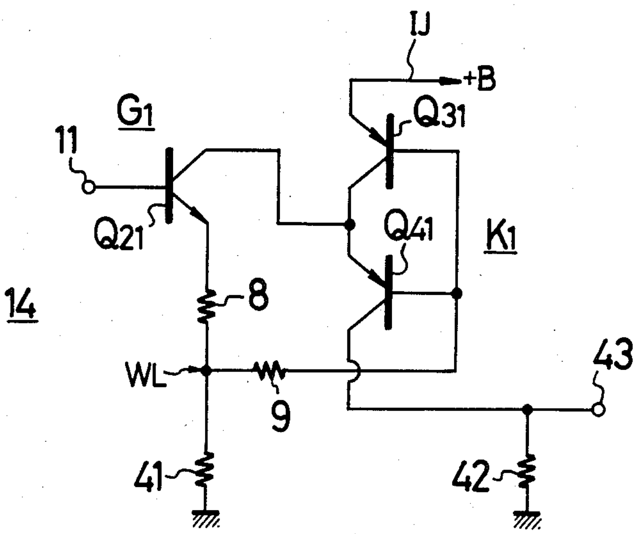
FIGS. 6 and 8 are respectively equivalent circuit diagrams of FIGS. 5 and 7 used to explain the operation thereof.

The operation of such D/A converter shown in FIG. 5 will be described in detail with reference to FIG. 6. FIG. 6 shows the gate circuit 14 of FIG. 5 (where one transistor Q11 is omitted) and the constant current circuit K1 thereof in an extracted fashion. Accordingly, in FIG. 6, like parts corresponding to those in FIG. 5 are marked with the same references. In FIG. 6, reference numeral 9 designates a wall resistor (distributed resistor) and 8 a distributed resistor between the emitter of the transistor Q21 and the wall WL. When the collector of the transistor Q21 is at high level, a current $I_0$ injected from the injector IJ is flowed into the load resistor 42 with the current hogging so that an analog output voltage is developed at the output terminal 43. At that time, the sum of the base currents of the transistors Q31 and Q41 is flowed into the wall WL, which is then flowed through the resistor 41 to the ground.

On the contrary, when the collector of the transistor Q21 is at low level, the current $I_0$ injected from the injector IJ is flowed through the transistor Q21 to the wall WL and then flowed through the resistor 41 to the ground. Thus, no current is flowed into the load resistor 42 so that the output voltage at the output terminal 43 becomes zero.

As described above, with the D/A converter shown in FIG. 5, when there is a current which is flowed into the wall WL, the current becomes twice the base current, while in other cases, the current becomes equal to the sum of the injection current and the base current. Thus, the potential at the wall WL is changed so that it is difficult for the outputs from the respective constant current circuits K1 to K3 to be held constant. As a result, the precision of the D/A converter is lowered.

In addition, it may be considered that a feedback circuit is used in place of the bias resistor 41 to make the potential at the wall WL constant. In this case, since the resistor component 9 exists in the wall WL, the potential at the wall WL becomes constant. However, when a large number of constant current circuits are provided, the potential at the wall WL is changed by the currents flowing from the respective constant current circuits to the wall WL, thus the above problem being left unsolved.

Figure 7:
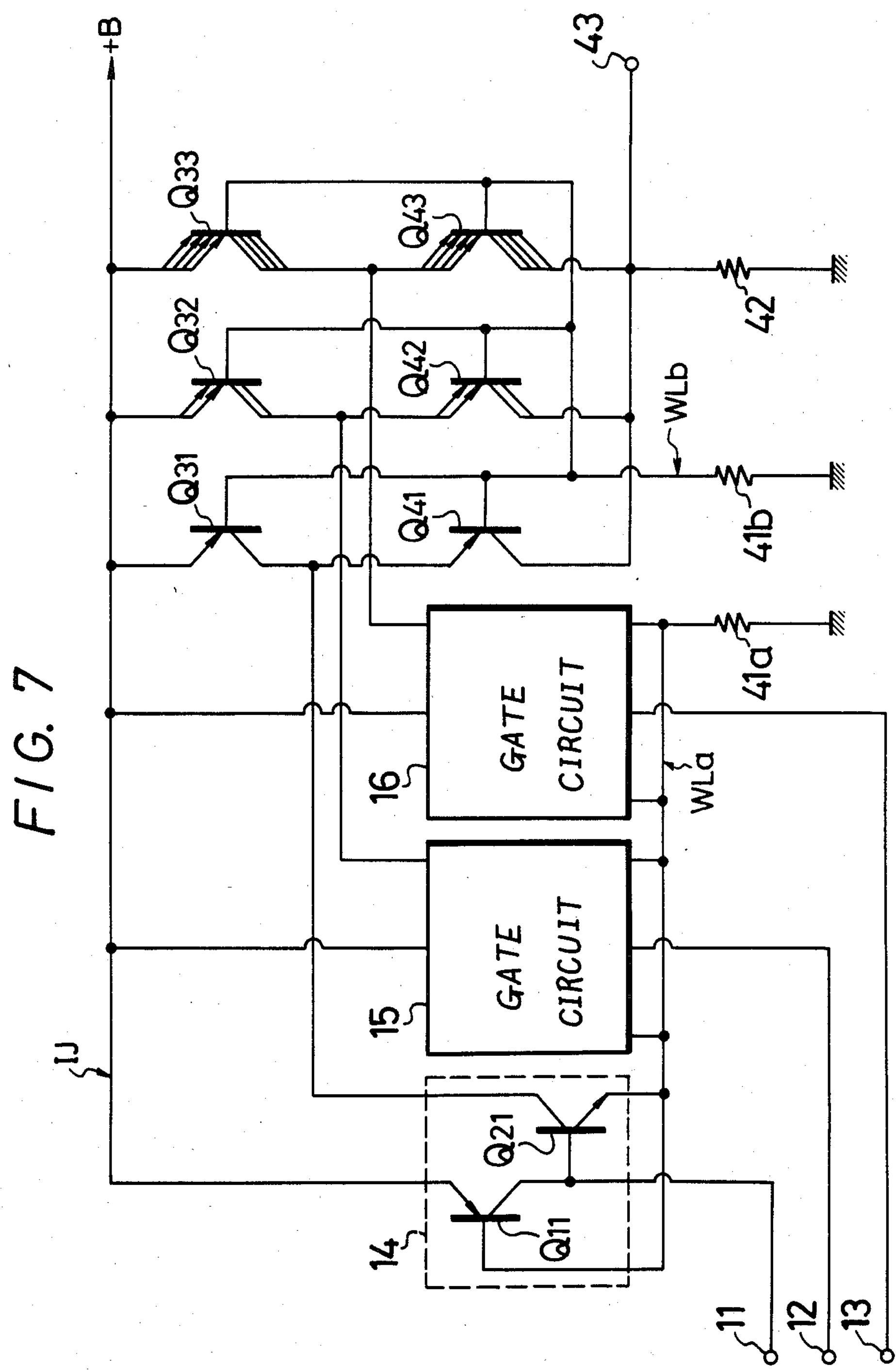

Another embodiment of the D/A converter according to the present invention will hereinafter be described with reference to FIG. 7. In FIG. 7, like parts corresponding to those in FIG. 5 are marked with the same references and will not be described in detail. In this embodiment, the injector IJ is common to the gate circuits 14 to 16 and the constant current circuits K1 to K3, but a wall $WL_a$ of the gate circuits 14 to 16 is separate from a wall $WL_b$ of the constant current circuits K1 to K3, and these walls $WL_a$ and $WL_b$ are respectively grounded through separate bias resistors 41a and 41b. These bias resistors 41a and 41b may be replaced with constant current sources, respectively. The other circuit arrangement of FIG. 7 is the same as that in FIG. 5.

Figure 8:
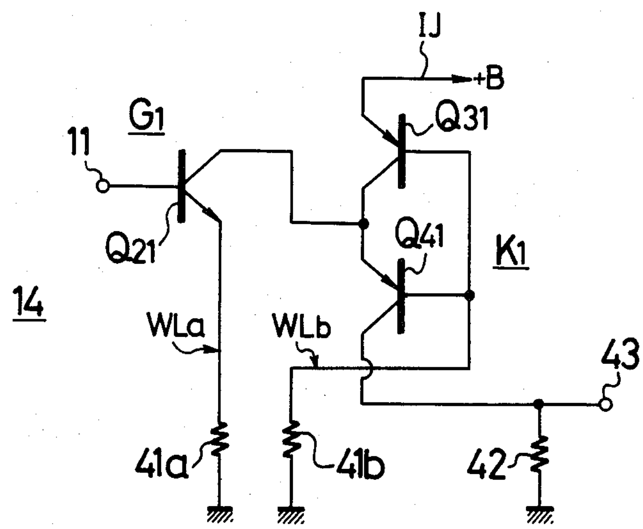

The operation of the D/A converter shown in FIG. 7 will be described with reference to FIG. 8. FIG. 8 shows the gate circuit 14 (the transistor Q11 is omitted) and the constant current circuit K1 in FIG. 7 in an extracted manner. When the collector of the transistor Q21 is at high level, the current $I_0$ injected from the injector IJ is flowed into the load resistor 42 so that the analog voltage is developed at the output terminal 43. At that time, the sum current of the base currents of the transistors Q31 and Q41 is flowed in the wall $WL_b$ of the constant current circuit K1. On the contrary, when the collector of the transistor Q21 is at low level, the current $I_0$ injected from the injector IJ is flowed through the transistor Q21 to the wall $WL_a$ of the gate circuit 14 so that only the base current of the transistor Q31 is flowed into the wall $WL_b$ of the constant current circuit K1. Accordingly, the current flowed into the wall WL of the constant current circuit K1 becomes equal to the sum of the base currents of the transistors Q31 and Q41 in a certain case, while in other case, it becomes equal to the base current of the transistor Q31. The difference therebetween becomes equal to the value of the base current of the transistor Q41. Therefore, as compared with the D/A converter in FIG. 5, the change of the analog output voltage due to the fluctuation of the current flowed into the wall becomes considerably small so that the precision of the D/A converter becomes significantly high.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. An integrated injection logic circuit comprising:

at least one constant current source transistor;

at least one switching inverter transistor;

an injector connected directly to a first reference potential; and a wall connected indirectly to a second reference potential.

2. An integrated injection logic circuit according to claim 1, wherein said wall is connected through a bias resistor to said second reference potential.

3. An integrated injection logic circuit according to claim 1, wherein said wall is connected through a constant current source to said second reference potential.

4. A digital to analog converter comprising:

a plurality of gate circuits each of which is formed of at least one constant current source transistor, at least one switching inverter transistor, an injector connected directly to a first reference potential, and a wall indirectly to a second reference potential through a bias resistor; and a plurality of constant current circuits the number of which is same as that of said gate circuits, each of said plurality of constant current circuits including first and second constant current source transistors connected in cascade, an injector connected directly to said first reference potential and a wall connected indirectly to said second reference potential through a bias resistor.

5. A digital to analog converter according to claim 4, wherein the injector of said constant current circuits is made common to the injector of said gate circuits and connected to said first reference potential.

6. A digital to analog converter according to claim 5, wherein the bias resistor of said gate circuits is made common to the bias resistor of said constant current circuits and connected to said second reference potential.

7. A digital to analog converter according to claim 5, wherein said bias resistor of said gate circuits and said bias resistor of said constant current circuits are connected directly to said second reference potential.

8. A digital to analog converter according to claim 5, wherein a constant current source is used instead of said bias resistor of said constant current circuits.

9. A digital to analog converter according to claim 8, wherein said bias resistor of said gate circuits and said constant current source of said constant current circuits are connected directly to said second reference potential.

10. A digital to analog converter comprising:

a plurality of gate circuits each of which is formed of at least one constant current source transistor, at least one switching inverter transistor, an injector connected directly to a first reference potential, and a wall connected indirectly to a second reference potential through a constant current source; and a plurality of constant current circuits the number of which is same as that of said gate circuits, each of said plurality of constant current circuits including first and second constant current source transistors connected in cascade, an injector connected directly to said first reference potential and a wall connected indirectly to said second reference potential through a bias resistor.

11. A digital to analog converter according to claim 10, wherein said injector of said constant current circuits is made common to said injector of said gate circuits.

12. A digital to analog converter according to claim 11, wherein said constant current source of said gate circuits is made common to the constant current source of said constant current circuits.

13. A digital to analog converter according to claim 11, wherein said constant current source of said gate circuits and said bias resistor of said constant current circuits are connected to said second reference potential.

14. A digital to analog converter according to claim 11, wherein a constant current source is used instead of said bias resistor of said constant current circuits.

15. A digital to analog converter according to claim 14, wherein said constant current source of said gate circuits and said constant current source of said constant current circuits are connected to said second reference potential.

16. A digital to analog converter according to claim 4, wherein at least one of said constant current circuits comprises a multi-transistor.

17. A digital to analog converter according to claim 10, wherein at least one of said constant current circuits comprises a multi-transistor.

* * * * *